(12) United States Patent
Miyazaki

(10) Patent No.: US 10,768,124 B2
(45) Date of Patent: Sep. 8, 2020

(54) SPECIMEN HOLDER

(71) Applicant: Mel-Build Corporation, Fukuoka-shi (JP)

(72) Inventor: Hiroya Miyazaki, Fukuoka (JP)

(73) Assignee: Mel-Build Corporation, Fukuoka (JP)

( * ) Notice: Subject to any disclaimer, the term of this patent is extended or adjusted under 35 U.S.C. 154(b) by 29 days.

(21) Appl. No.: 16/359,574

(22) Filed: Mar. 20, 2019

(65) Prior Publication Data
US 2019/0310209 A1  Oct. 10, 2019

(30) Foreign Application Priority Data

Apr. 10, 2018  (JP) ................. 2018-075670

(51) Int. Cl.
| | | |
|---|---|---|
| *G01N 23/20033* | (2018.01) | |
| *H01J 37/26* | (2006.01) | |
| *H01J 37/20* | (2006.01) | |

(52) U.S. Cl.
CPC ........ *G01N 23/20033* (2013.01); *H01J 37/20* (2013.01); *H01J 37/26* (2013.01); *H01J 2237/2001* (2013.01); *H01J 2237/202* (2013.01); *H01J 2237/2007* (2013.01); *H01J 2237/2065* (2013.01); *H01J 2237/20207* (2013.01); *H01J 2237/20271* (2013.01)

(58) Field of Classification Search
CPC .... G01N 23/20033; H01J 37/26; H01J 37/20; H01J 2237/202; H01J 2237/2007; H01J 2237/20271; H01J 2237/2065; H01J 2237/2001; H01J 2237/20207
See application file for complete search history.

(56) References Cited

U.S. PATENT DOCUMENTS

| | | | | | |
|---|---|---|---|---|---|
| 4,427,891 | A | * | 1/1984 | Georges ................. | H01J 37/20 250/442.11 |
| 4,950,901 | A | * | 8/1990 | Jones ..................... | H01J 37/20 250/443.1 |
| 5,753,924 | A | * | 5/1998 | Swann ................... | H01J 37/20 250/440.11 |
| 5,986,270 | A | * | 11/1999 | Bormans ............... | H01J 37/20 250/442.11 |
| 6,410,925 | B1 | * | 6/2002 | Armbruster ........... | H01J 37/20 250/442.11 |

(Continued)

FOREIGN PATENT DOCUMENTS

| | | | | |
|---|---|---|---|---|
| EP | 0538861 | A1 * | 4/1993 | ............. H01J 37/20 |
| JP | S48/073560 | A | 12/1971 | |

(Continued)

*Primary Examiner* — Jonathan M Dunlap
(74) *Attorney, Agent, or Firm* — ALG Intellectual Property, LLC

(57) ABSTRACT

In at least one embodiment, a specimen holder includes a specimen holder shaft unit having a specimen and/or specimen mesh setting unit, an outer tubular unit capable of housing the specimen holder shaft unit, a thermal drift adjusting unit made of a material having a different thermal expansion coefficient from a thermal expansion coefficient of the specimen holder shaft unit and partially in contact with the specimen holder shaft unit, and a control mechanism which controls movement of the thermal drift adjusting unit toward a center direction of a specimen.

11 Claims, 3 Drawing Sheets

(56) References Cited

U.S. PATENT DOCUMENTS

| | | | |
|---|---|---|---|
| 7,705,324 B2* | 4/2010 | Miyazaki | H01J 37/20 250/311 |
| 8,148,700 B2* | 4/2012 | Miyazaki | H01J 37/20 250/442.11 |
| 8,336,405 B2 | 12/2012 | Stabacinskiene et al. | |
| 8,653,476 B2* | 2/2014 | Miyazaki | H01J 37/20 250/440.11 |
| 10,242,841 B2* | 3/2019 | Miyazaki | H01J 37/20 |
| 2006/0097187 A1* | 5/2006 | Zandbergen | H01J 37/20 250/440.11 |
| 2007/0063148 A1* | 3/2007 | Miyazaki | H01J 37/20 250/442.11 |
| 2010/0006771 A1* | 1/2010 | Miyazaki | H01J 37/20 250/442.11 |
| 2011/0240881 A1* | 10/2011 | Miyazaki | H01J 37/20 250/442.11 |
| 2012/0024086 A1* | 2/2012 | Stabacinskiene | G01N 23/20033 73/864.91 |
| 2012/0025103 A1* | 2/2012 | Deshmukh | H01J 37/20 250/491.1 |
| 2018/0096817 A1* | 4/2018 | Miyazaki | H01J 37/26 |

FOREIGN PATENT DOCUMENTS

| | | |
|---|---|---|
| JP | 2007-179805 A | 7/2007 |
| JP | 2013-537689 A | 10/2013 |

* cited by examiner

[Fig. 1]
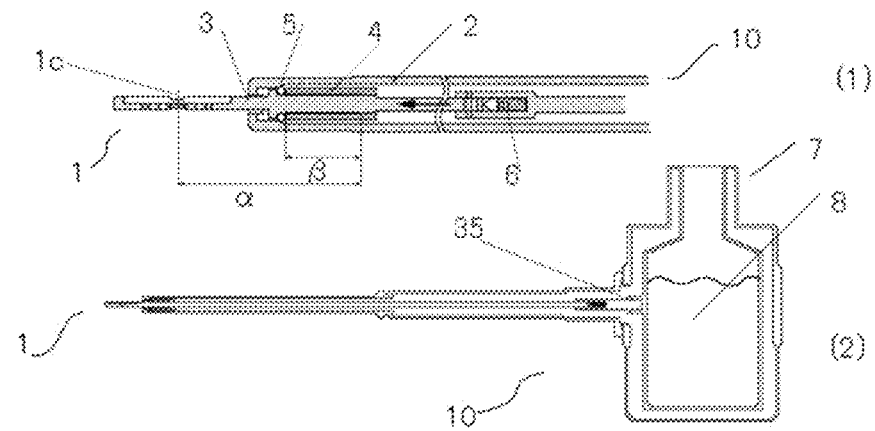
[Fig.2]
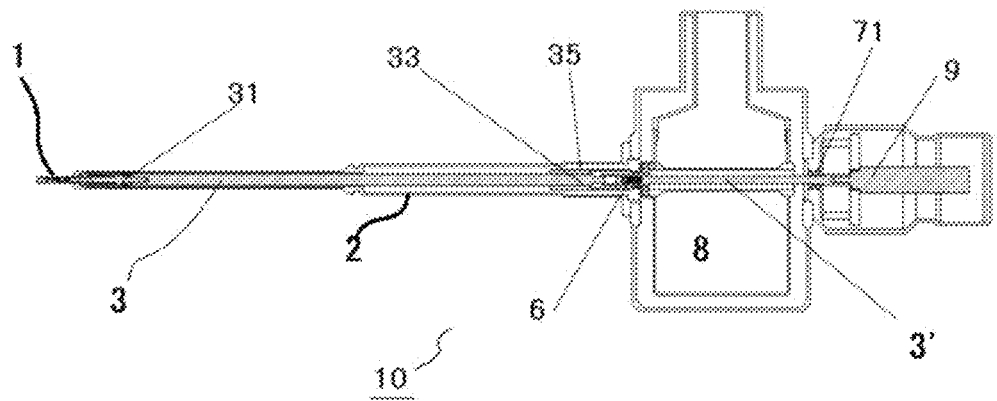

[Fig.3]
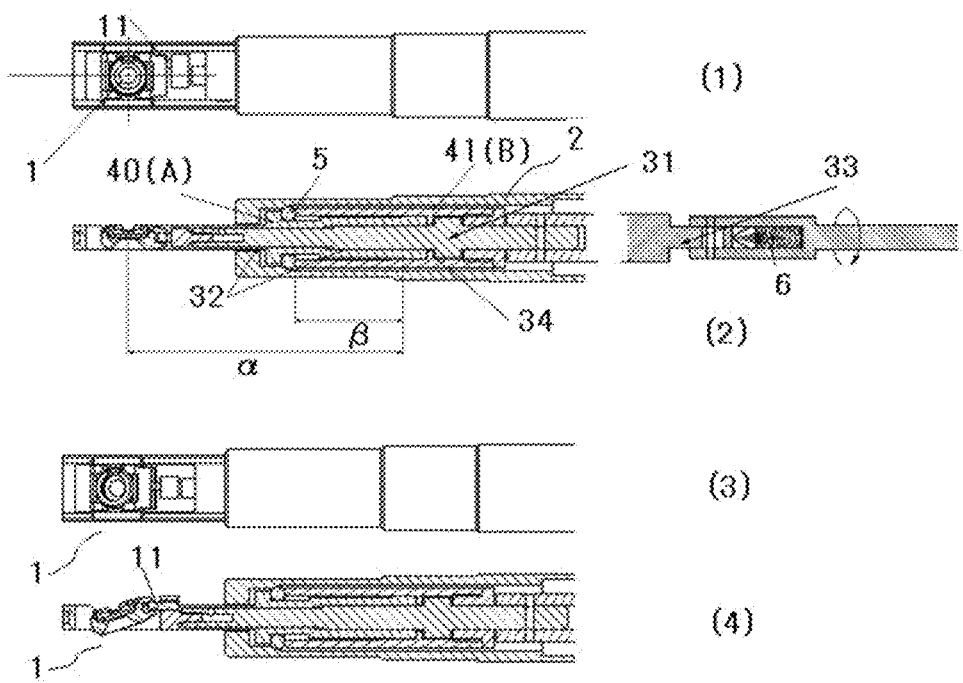
[Fig.4]
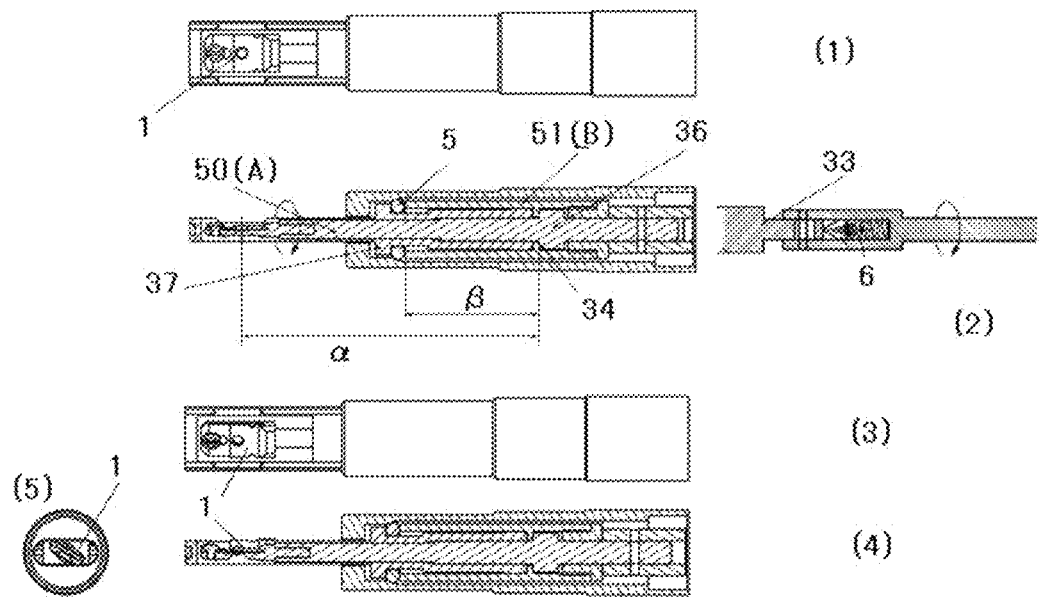

[Fig.5]
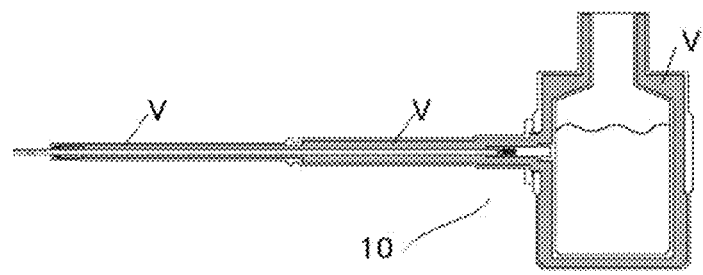
[Fig.6]
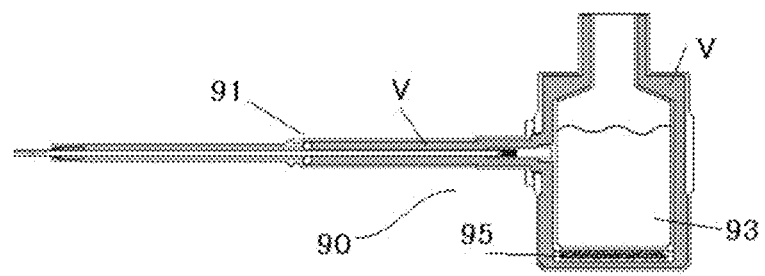

SPECIMEN HOLDER

TECHNICAL FIELD

The present disclosure is related to specimen holders which can be used for visualization, image formation or analysis of a specimen. More specifically, it is related to specimen holders capable of adjusting a thermal drift.

BACKGROUND ART

Nowadays, since an observation or analysis of a specimen at molecular or atomic level is needed, electron microscopic observation which is combined with high-resolution imaging and analysis techniques under a severe environment is in demand. In recent years, in order to meet the requests of the observations under extreme low temperature, various models of specimen holders for low temperature have been developed.

For example, as a specimen holder for positioning a specimen at an observation position in a transmission electron microscope (TEM), a TEM specimen holder is known, which comprises a specimen holder main body with a first opening having steps in its interior, a specimen holding member which is rotatably contained in the first opening with the periphery of the specimen holding member being partially supported by the steps and a second opening for holding the specimen at a central portion, and a cover member with an amorphous material film covering the second opening except for at least a part of the second opening (Patent Literature 1).

Moreover, a low temperature specimen holder for receiving, cooling and positioning a specimen in at least one of an imaging and analysis devices, is known, comprising a container for receiving and supporting said specimen; a storage container for storing a liquid cooling medium having a collection point for such liquid cooling medium; a thermal conductor in thermal connection with the liquid cooling medium and the storage container wherein the thermal conductor is in proximal contact with the liquid cooling medium at the collection point irrespective of the stored volume of the liquid cooling medium within and the spatial orientation of the storage container; and an elongated barrel mounted between the container and the storage container for positioning the specimen at a preselected location within at least one of the imaging and analytical device (Patent Literature 2).

PRIOR ART LITERATURES

Patent Literatures

[Patent Literature 1] Japanese Unexamined Patent Application Publication No. 2007-179805
[Patent Literature 2] Japanese Unexamined Patent Application Publication No. 2013-537689

SUMMARY

In the known specimen holder including the one of Patent Literature 1, since a structural member which is a part of a main axis of a specimen holder is interposed between the action point of X-axis driving of the specimen holder and the location of a specimen (later, the area of the structural member, i.e. the area between the action point of X-axis driving of the specimen holder and the location of a specimen, is called an area of X-driving remote distant length), thermal expansion or thermal shrinkage of the structural member on the axis will occur when the structural member at the area of the X-driving remote distance length is exposed to a temperature change. As a result, the structural member will expand or shrink on the axis in a longitudinal direction of the specimen holder, and the location of the specimen will be out of the position of an electron beam.

Moreover, there is another problem that the action point of X-driving will change due to thermal expansion or thermal shrinkage together with a holding tube of a specimen holder when the holding tube of the specimen holder itself is exposed to temperature changes. This is because linking members for the X-axis driving of the specimen holder are installed in the holding tube of the specimen holder. As a result, the position of the specimen existed on a part of the main axis of the specimen holder will be relatively shifted with respect to the position of an electron beam.

In particular, since the work of attaching the specimen to the specimen holder is normally carried out in the atmosphere of a room, the temperature of the main shaft unit of the specimen holder is under the influence of the room temperature. However, when the holder is attached to an electron microscope (hereinafter referred to as "EM") after the attaching the specimen to the holder, the impact factor to the temperature of the main shaft unit changes from the room temperature to the temperature interior of the electron microscope and the area of the X-driving remote distant length continues to change until the temperature difference comes to an equilibrium state.

Moreover, it should be noted that an EM always generates Joule heat using a plurality of electron beam focusing lens coils due to convergence control of the electron beam. In order to dissipate the above heat, cooling water is kept flowing to and mitigating the heat generated by the using of the electron beam focusing lens coils. However, since the temperature inside the housing of a general EM is higher than a room temperature, the temperature of the member of the spindle of the specimen holder starts rising and thermal expansion due to the temperature continues until reaching the temperature equilibrium when the specimen holder is attached to the EM.

That is, as long as the temperature difference is caused, the area of the X-driving remote distant length continues to increase so that the position of the specimen continues to be relatively shifted with respect to the position of the electron beam. This leads to a problem that the user has to wait until the time when a specimen drift comes to settle down to the level that the user can start observation of a specimen.

Basically, the waiting time until the specimen drift settles down depends on the resolution (magnification) that the user needs. However, in the case of acquiring data at the nanometer scale with a high resolution, even a nanometer scale of specimen drift becomes a problem, and the waiting time may result in several hours.

Furthermore, since a specimen driving device causes a specimen drift as a result of the thermal expansion change of main members of the specimen driving device due to the influence from the fluctuation of room temperature, the user of the EM has to keep the room temperature of the EM installation room constant (an ideal EM installation room should normally be at room temperature of 20° C. and a variation range of the temperature should be ±0.1° C. or less). Even though the user considers achieving a temperature-controlled state of the installation environment of the EM as much as possible, the temperature control is actually limited to the room temperature of 20° C.±0.1° C. at best.

Furthermore, in actual usage of an EM, while the user may enter, exit and stay in the room where the EM is installed for specimen replacement work and operation (operation) of the EM, a temperature-controlled state is required inside the room. Despite of the requirement, it is impossible to keep the substantial room temperature at 20° C.±0.1° C. due to the opening and closing of the door and the change in the number of people (calorific value) staying in the room.

Furthermore, the influence of the heat from human bodies performing the operation of the device is a factor which disturbs the stability of air flow in the EM installation room. As a result, the stability of the temperature in the vicinity of the specimen driving device provided for the EM is inevitably disturbed.

Also in some of the temperature control of conventional specimen holders including the above-mentioned Patent Document 2, a heater is arranged on a holder shaft for thermal conduction and the holder shaft is heated to control the temperature at the tip of the holder.

Furthermore, holders of the prior art (existing models) requires a long waiting time until the temperature stabilizes, another waiting time for thermal equilibrium, and finally allow the user to obtain images of the atomic resolution only at the moment when liquid nitrogen disappears (the moment of losing cooling ability). With such holders of the prior art, it takes about 3 hours no matter how short it may be. To perform energy dispersive X-ray spectrometer (hereinafter referred to as "EDS") analysis (so-called EDS mapping/column mapping) by an EDS with an atomic resolution, a drift is a hindrance. Since the zero-state of drift should be kept at least one hour in order to perform EDS analysis, the EDS analysis cannot be achieved in the existing holders.

In addition, since the images obtained by a transmission electron microscope (TEM) are for the nanometer-scale observation, the vicinity of a tip portion of a specimen holder needs to be firmly held with respect to a holder frame. However, there is a problem that the holding means of the prior art are insufficient and not good at a temperature stability due to heat inflow from the holder frame.

Moreover, in the case that it is necessary for a conventional cooling holder to perform the X-axis tilt with the TEM, the holder is tilted by the device of the TEM so that a tank containing liquid nitrogen also inclines. Consequently, the liquid nitrogen sways and touches warm parts of the tank; it evaporates to cause a bubbling phenomenon, leading to a problem of image shake. Also, when the X-axis tilt angle becomes a high tilt angle (for example, 60 degrees), liquid nitrogen spills out because the liquid nitrogen is contained in the tank. In this way, the X-axis tilt of the holder during cooling has been problematic in many cases.

In order to solve the above problems, an objective of the present disclosure is to provide specimen holders, which mitigate or suppress negative influences of the thermal drift generated during heating/cooling a specimen, and is usable in image forming or analyzing apparatuses with high resolution.

Solution to Problem

For the above objective, the inventor has conceived the present disclosure as a result of diligent study of the structures of specimen holders, which satisfies requirements including better response to thermal drift during cooling/heating.

That is, a specimen holder of the present disclosure is characterized by comprising a specimen holder shaft unit having a specimen and/or specimen mesh setting unit, an outer tubular unit capable of housing the specimen holder shaft unit, a thermal drift adjusting unit made of a material having a different thermal expansion coefficient from a thermal expansion coefficient of the specimen holder shaft unit and partially in contact with the specimen holder shaft unit, and a control mechanism which controls movement of the thermal drift adjusting unit toward a center direction of the specimen.

Further in a preferred embodiment of the specimen holder of the present disclosure, it is characterized in that the control mechanism is a hard ball.

Further, in a preferred embodiment of the specimen holder of the present disclosure, it is characterized in that the specimen holder further includes a pushing mechanism capable of pushing the specimen holder shaft unit toward the center direction of the specimen.

Further, in a preferred embodiment of the specimen holder of the present disclosure, it is characterized in that an inner wall of the outer tubular unit further includes a tapered portion which is in contact with the control mechanism.

Further, in a preferred embodiment of the specimen holder of the present disclosure, it is characterized in that the specimen holder shaft unit is rotatable around an axis of the specimen holder.

Further, in a preferred embodiment of the specimen holder of the present disclosure, it is characterized in that the specimen and/or specimen mesh setting unit is rotatable around the axis of the specimen holder shaft unit, or is rotatable around an axis orthogonal to an axial direction of the specimen holder shaft unit.

Further, in a preferred embodiment of the specimen holder of the present disclosure, it is characterized in that rotation around the axis orthogonal to the axial direction of the specimen holder shaft unit is performed via an offset cam mechanism.

Further, in a preferred embodiment of the specimen holder of the present disclosure, it is characterized in that the specimen holder further includes an inner tubular unit between an outer side of the specimen holder shaft unit and the outer tubular unit, and the thermal drift adjusting unit is partially in contact with the inner tubular unit.

Further, in a preferred embodiment of the specimen holder of the present disclosure, it is characterized in that the specimen holder further includes a cooling mechanism capable of cooling the specimen holder shaft.

Further, in a preferred embodiment of the specimen holder of the present disclosure, an outer wall surface of the specimen holder shaft unit and an inner wall surface of the outer tubular unit are mirror-finished.

Further, a method of drawing a vacuum of the present disclosure is characterized in that the method is a method of drawing a vacuum in the specimen holder of the present disclosure in an electron microscope, and the method is carried out by using vacuum exhaust of the electron microscope.

Moreover, note that the specimen holder of the present disclosure can be used in an image forming apparatus or an analyzing apparatus such as an electron microscope.

Effects of Invention

According to the specimen holder of the present disclosure, there is an advantageous effect that the response of cooling/heating is good and the influence of thermal drift can be minimized as much as possible. Further, according to the specimen holder of the present disclosure, since the influence of thermal drift is minimized and the degree of vacuum in the specimen holder shaft unit can be kept constant, it is no substantial shortcoming in practical use due to unevenness of radiant heat from the periphery of an image forming apparatus or an analysis apparatus using the specimen holder. Further, there is an advantageous effect that in the specimen holder of the present disclosure, by using a ball or the like in contact with the tapered surface without using a seal in the shaft unit, a point contact can be utilized so that heat inflow to the specimen holder can be significantly reduced.

Further, according to the specimen holder of the present disclosure, an advantageous effect is that the holder can be used as a dual-axis tilt holder while fulfilling suppression of thermal drift.

BRIEF DESCRIPTION OF DRAWINGS

FIG. 1 is a lateral cross sectional view of a specimen holder in one embodiment of the present disclosure. FIG. 1 (1) is an enlarged view of a lateral cross section of a thermal drift adjusting unit of the specimen holder, and FIG. 1 (2) shows a lateral cross section of the entire specimen holder.

FIG. 2 shows a lateral cross section of a specimen holder in one embodiment of the present disclosure.

FIG. 3 is an enlarged view of a thermal drift adjusting unit of a specimen holder in one embodiment of the present disclosure. FIG. 3 (1) shows a partial enlarged plane in a state where the specimen setting unit is not tilted in the Y-axis, and FIG. 3 (2) shows a lateral cross section in a state where the specimen setting unit is not tilted in the Y-axis. FIG. 3 (3) shows a partial enlarged plane in a state where the specimen setting unit is tilted in the Y-axis, and FIG. 3 (4) shows a lateral cross section in a state where the specimen setting unit is tilted in the Y-axis.

FIG. 4 is an enlarged view of a thermal drift adjusting unit of the specimen holder in an embodiment of the present disclosure. FIG. 4 (1) shows a partial enlarged plane in a state where the specimen setting unit is not tilted in the X-axis direction, and FIG. 4 (2) shows a lateral cross section in a state where the specimen setting unit is not tilted in the X-axis. FIG. 4 (3) shows a partial enlarged plane in a state where the specimen setting unit is tilted in the X axis, and FIG. 4 (4) shows a lateral cross section in a state where the specimen setting unit is inclined in the X axis. FIG. 4 (5) shows a cross section in a state where the specimen setting unit is tilted by the X axis.

FIG. 5 is a schematic diagram of evacuation in a specimen holder in one embodiment of the present disclosure.

FIG. 6 is a schematic diagram of evacuation in a prior art specimen holder.

DESCRIPTION OF EMBODIMENTS

A specimen holder of the present disclosure is characterized by comprising a specimen holder shaft unit having a specimen and/or specimen mesh setting unit, an outer tubular unit capable of housing the specimen holder shaft unit, a thermal drift adjusting unit made of a material having a different thermal expansion coefficient from a thermal expansion coefficient of the specimen holder shaft unit and partially in contact with the specimen holder shaft unit, and a control mechanism which controls movement of the thermal drift adjusting unit toward a center of the specimen. The specimen holder shaft unit having the specimen and/or specimen mesh setting unit is not particularly limited, and may have only a specimen setting unit for placing the specimen. In the present disclosure, there is provided a thermal drift adjusting unit made of a material having a coefficient of thermal expansion different from the thermal expansion coefficient of the specimen holder shaft unit. This aims at offsetting or reducing the change in thermal drift occurring in the specimen and/or the specimen mesh setting unit utilizing the difference in thermal expansion coefficients. In the present disclosure, by providing a thermal drift adjusting unit made of a material having a coefficient of thermal expansion different from the coefficient of thermal expansion of the specimen holder shaft unit, for example, by selecting a material from those in a certain range of thermal expansion coefficients, it is possible to suppress the thermal drift at a desired level from rough to fine adjustment according to the demand for the observation accuracy to the observation target.

The present disclosure comprises a control mechanism for controlling the movement of the thermal drift adjusting unit toward the direction of the specimen center. When thermal drift occurs in the specimen holder, the thermal drift adjusting unit also thermally expands or contracts. By controlling the movement of the thermal drift adjusting unit, for example, the movement in the direction towards the center of the specimen according to the control mechanism, it is possible to change the direction of movement due to thermal drift of the specimen and/or specimen mesh setting unit to the opposite direction of movement. The degree of movement of the thermal drift adjusting unit can be adjusted by selection of a material in a certain range of coefficients of thermal expansion.

In this way, the present disclosure can provide a structure for stopping thermal drift by utilizing the difference in coefficient of thermal expansion of materials. A specimen holder, for example, a cooling holder has a requirement as to how thermal drift can be suppressed at the time of acquiring atomic resolution images. For example, in FIG. 1, in a condition that a material of specimen holder shaft unit 3 is material A and a material of a thermal drift adjusting unit is material B, a ratio at the thermal expansion coefficient (for example, at a time of a thermal shrinkage) of the material A and the material B, may be compared with a ratio of a material length α and a material length β. For example, if a material whose coefficient of thermal expansion is $6.0 \times 10^{-6}/°$ C. is chosen as the material A and another material whose coefficient of thermal expansion is $17 \times 3 - 10^{-6}/°$ C. is chosen as material B, the thermal expansion ratio is 6 to 17.3. It is understood that the material B shrinks more and the material A shrinks less. To deal with how much the material B shrinks, when a holder is initially under vacuum drawing toward the center portion of a microscope etc., or an elastic member such as a spring that may be installed behind (a space closer to a handle of a specimen holder), a structure of pushing-back in the structure of the holder makes the specimen holder shaft unit move toward the center direction of the microscope.

Accordingly, the material lengths α and β may be set so that pushing amount (length) of the material B can equal to the amount (length) of the shrinkage of the material A. Depending on the accuracy required for the observation sample, it is not required to make the lengths exactly the same as far as it is within the margin of error. In this way, even if the lengths are more or less different, an object of mitigating thermal drift can be achieved.

In the present disclosure, the result that an amount of elongation plus an amount of shrinkage equal to zero indicates that the drift disappears. It is necessary to determine the length of the material A on the geometry to some extent. After the length of the material A is determined, the length of the material B can be determined and the position of a reference surface can also be determined.

Moreover, note that stuff and materials having a thermal expansion coefficient are not particularly limited since the mechanism according to the present disclosure is based on a technique utilizing the difference in thermal expansion coefficients.

Further, the thermal drift adjusting unit can be brought into contact with and fixed to a part of the specimen holder shaft unit. This arrangement of the contact and fixation allows to set the similar temperature to that of the specimen holder shaft and to change the direction of movement due to thermal drift of the specimen mesh setting unit smoothly into a motion in the opposite direction.

Further, in a preferred embodiment of the specimen holder of the present disclosure, the control mechanism is a hard ball. It is preferable that the hard ball has a certain degree of hardness and low thermal conductivity. For example, a material having hardness, low thermal expansion and low thermal conductivity like those of zirconia, titanium 64 (TC4 or Ti-6Al-4V), ceramics is preferable for the hard ball. On the other hand, material of the hard ball is not particularly limited as long as it has a ball shape; a resin ball or a glass ball may be used as the hard ball. The hardness of the hard ball can be set within the margin of structural stability for the specimen holder.

Further, in a preferred embodiment of the specimen holder of the present disclosure, the specimen holder has a pushing mechanism capable of pushing the specimen holder shaft unit toward the center direction of the specimen. The pushing mechanism is not particularly limited as long as the specimen holder shaft unit can be pushed toward the center direction of the specimen. When applied to a microscope or the like, the specimen holder is generally drawn by evacuation toward the center direction of the microscope, and a pushing mechanism is not necessary depending on the way of use. Additionally to this, the precision can be further improved by the pushing mechanism. The pushing mechanism is not particularly specified, but for example, an elastic member such as a spring, a coil spring, a leaf spring or a plunger or the like can be mentioned.

Further in the present disclosure, the inner wall of the outer tubular may comprise a tapered portion in contact with the control mechanism. The control mechanism can control the movement of the thermal drift adjusting unit, for example, the movement toward the center direction of the specimen. Installation of a tapered portion in contact with the control mechanism further makes it possible to control with stabilizing the shaft. For example, the movement of the specimen holder shaft towards the center of the specimen can be stopped by a spring or the like pushing the amount corresponding to thermal absorption, and this can be used as a reference of heat shrinkage. Moreover, biting of the control mechanism such as a ball or the like into the tapered portion will lead to firm holding of the tip of the specimen holder, stopping the influence of external influences such as bubbling of liquid nitrogen, and suppressing the vibrations of nanometer scale during high resolution imaging. Further, by employing higher thermal insulation property for the control mechanism, the thermal insulation is made higher and area in contact with an outer frame of a specimen holder is reduced. Especially when a ball-shaped member is used as the control mechanism, the area is reduced to a point. As a result, it is possible to suppress the inflow of heat from the holder frame as much as possible and to improve the heat stabilization. Since the TEM imaging is for nanometer-scale observations, the vicinity of the tip portion needs to be firmly held with respect to the specimen holder frame. A completely different conventional method for holing the tip portion resulted in poor temperature stability due to the inflow of heat from the specimen holder frame. The method of the present disclosure can solve this problem.

In a preferred embodiment, in the present disclosure, the specimen holder shaft unit can be made rotatable around the specimen holder axis (also referred to as an X-axis tilt, an α tilt, or a single-axis tilt; the TEM device generally performs these types of tilting. In the present disclosure, the specimen holder can also perform the X-axis tilt.). By allowing the specimen holder to rotate around the specimen holder axis, the specimen and/or specimen mesh setting unit can also be made rotatable around the specimen holder axis, and observation of the rotated specimen or the like is also made possible. Conventional method of rotation can be employed and the way of rotation is not particularly limited. For example, using the handle of the specimen holder may be employed for the rotation.

Further, in the present disclosure, as a result of the rotation, the specimen and/or specimen mesh setting unit is made rotatable about the axis of the specimen holder shaft unit as described above, and the specimen and/or specimen mesh setting unit is rotatable about the orthogonal axis to the axial direction of the specimen holder shaft unit. A conventional means may be employed for the mechanism for allowing the rotation about the axis orthogonal to the axial direction of the specimen holder shaft unit and the mechanism is not particularly limited as well. In a preferred embodiment, the rotation around an axis orthogonal to the axial direction of the specimen holder shaft unit can be performed via an offset cam mechanism.

Further, in a preferred embodiment of the specimen holder of the present disclosure, the specimen holder may further comprise a cooling mechanism capable of cooling the specimen holder shaft. The arrangement position of the cooling mechanism is not particularly limited. The cooling mechanism may be located, for example, in a space closer to the handle of the specimen holder. The cooling mechanism, more specifically which uses liquid nitrogen, liquid helium, or the like, may cool the specimen holder shaft and the specimen in the end.

Further, in a preferred embodiment of the specimen holder of the present disclosure, the cooling mechanism is capable of cooling the specimen holder shaft unit from the viewpoint of efficiently cooling the specimen.

Further, in a preferred embodiment of the specimen holder of the present disclosure, it is characterized in that the cooling mechanism comprises a heat conduction unit for conducting heat to the specimen holder shaft unit. Due to the existence of such a heat conduction unit, when liquid nitrogen or the like is utilized, a cooling mechanism is structured so that the bottom of the container for the liquid nitrogen and the specimen holder shaft can be linked with the heat conduction unit made of heat conducting members, it is possible to transmit the temperature of the liquid nitrogen to the specimen holder shaft and the specimen in the end until the liquid nitrogen is exhausted.

In the present disclosure, the heat conduction unit is not particularly limited as long as heat can be efficiently conducted, and examples thereof include a copper alloy, pure copper, A 7075, and the like. In addition, copper mixed with carbon (STC), and anything may be applied as long as it is good heat conductive and tolerant to machining.

Further, in the present disclosure, a heat propagating clamp member may be employed between the cooling mechanism containing liquid nitrogen or the like and the specimen holder shaft unit (handle side thereof).

In a preferred embodiment of the present disclosure, an outer wall surface of the specimen holder shaft unit and an inner wall surface of the outer tubular unit are preferably mirror-finished. The outer wall surface of the specimen holder shaft unit of the present disclosure and the inner wall surface of the outer tubular unit may be mirror-finished. By adopting such a constitution, the following advantages can be obtained.

The method of drawing a vacuum in a Dewar unit of an existing cooling holder (specimen holder) is as follows. 1. Heat synthetic zeolite (e.g. zeolum (R)) for about 3 hours while drawing a vacuum. Wait about 3 hours until zeolite returns to a room temperature. 2. Insert the specimen holder into the TEM or the like. 3. Place liquid nitrogen in a cooling container. 4. After placing liquid nitrogen, zeolite adsorbs molecules to increase vacuum degree of the Dewar; vacuum insulation and cooling is achieved.

The problems of the method of holding a vacuum of the existing Dewar are as follows. 1. The adsorption capacity of zeolite gradually degrades over cooling time. The possible number of refilling liquid nitrogen is limited. 2. Since the degree of vacuum is unstable, uneven irradiation heat to the shaft causes unstable thermal drift. As a result, thermal drift makes it difficult to acquire data at high resolution (atomic resolution) with TEM or the like. 3. Moreover, it is necessary to insulate the vacuum between the TEM and the Dewar and a sealing member is inevitable. On the other hand, heat flows through the sealing member to the shaft, which also becomes an influence of thermal drift. Further, due to the heat inflow the cooling arrival time and the reaching temperature degrade. 4. Due to the saturation of adsorption of zeolite, drawing a vacuum and heating work of zeolite which takes about 6 hours to the next observation are required after completion of observation.

On the other hand, in the method of drawing a vacuum in the Dewar using an example specimen holder according to the present disclosure, it is possible to draw a vacuum completely by TEM or the like. That is, it is characterized in that the vacuum drawing method of the present disclosure is a method of drawing a vacuum the specimen holder of the present disclosure in an electron microscope, and drawing a vacuum is performed utilizing vacuum exhaustion of the electron microscope side.

Advantages of the vacuum drawing method using the specimen holder of an example of the present disclosure are as follows. 1. It is unnecessary to use any sealing unit, and it is not necessary to carry out vacuum drawing on both the cooler side and the specimen holder tip unit side. Keeping the same degree of vacuum can be achieved in all area so that no negative effect of non-uniform radiant heat (heat from external environment) exists (uniform radiant heat can be achieved.). 2. No intermittent sealing unit significantly reduces heat inflow from the unit side of TEM or the like. 3. It is possible to employ pushing the above-mentioned shrink surface made by the different materials by a spring, and utilize anything with a small contact area as a control mechanism. This also leads to reducing the negative influence of heat inflow from a side of the devices of TEM or the like. 4. The advantages mentioned above significantly improve temperature stability of heat transmitting shafts and thermal drift influences are suppressed. This vacuum drawing method reduces impacts of heat inflow and radiant heat. The combination of the method and thermal drift reducing mechanism utilizing heat shrinkage according to the materials allows stable high resolution imaging even if it is under cooling. 5. Auxiliary effects: since drawing a vacuum can be totally performed by utilizing vacuum exhaustion of the electron microscope side, heating and vacuum drawing of zeolite as a preparation becomes unnecessary. Conventionally, due to the 6 hours of waiting for the observation of the next specimen, only one observation has been allowed per day. A cooling immediately after reaching room temperature with the present disclosure which takes less time allows more occasions of observation per day.

Hereinafter, examples of the specimen holder of the present disclosure will be described, but the present disclosure is not to be construed as being limited to these examples. It goes without saying that it is possible to make changes as appropriate without departing from the gist of the present disclosure.

Example 1

Hereinafter, an embodiment of the specimen holder of the present disclosure will be described with reference to the drawings.

FIG. 1 is a cross-sectional view of an example of a specimen holder 10 in one embodiment of the present disclosure. In FIG. 1, a specimen setting unit 1, an outer tubular of the specimen holder 2, a specimen holder shaft unit 3, a thermal drift adjusting unit 4, a hard ball 5, a pressing member 6, a cooling mechanism 7, and a coolant 8 are shown respectively. As the specimen setting unit 1, the specimen installing member 1 may alternatively be a specimen mesh installing member, or a combination of a specimen installing member and a specimen mesh installing member.

In the first embodiment, the hard ball 5 is an example of control mechanism for controlling the movement of the thermal drift adjusting unit 4 in the direction toward a specimen center 1c.

In the first embodiment, the pressing member 6 has a function capable of pushing the specimen holder shaft unit 3 in the direction toward the specimen center 1c (the pointing direction of the arrow in FIG. 1). For example, a spring or an elastic member may be used as the pressing mechanism 6.

In the first embodiment, the hard ball 5 may be used as a basis of heat shrinkage for stopping the specimen holder shaft unit 3 pushed out by the pressing mechanism 6 (e.g., a spring) by the amount of heat shrinkage. By pressing the hard ball 5 against the taper angle (or tapered portion) formed on the inner surface of the outer tubular unit 2, the basis is set. Moreover, the ball can bite into the tapered portion to hold the tip firmly so that the effects of vibrations due to external influences such as bubbling of liquid nitrogen will be stopped, and nanometer scale vibration in high resolution imaging will be suppressed. Moreover, in this example, the specimen holder shaft unit 3 may be provided with protruding and/or groove portions where the hard ball 5 are received.

Further, as the hard ball 5, by using a member having a certain degree of hardness and a ball shape with low thermal conductivity (or high thermal insulation property), the thermal insulation property will be enhanced. A part of the hard ball 5 which is in contact with the tapered portion of the outer tubular unit 2 is a point contact so that heat inflow via the outer tubular unit 2 can be suppressed as much as possible. Consequently, the temperature stability in the specimen holder 10 is improved. As a material for the hard ball, any of those with hardness similar to the hardness of zirconia, TI (titanium) 64, ceramics, and the like, low thermal expansion and low thermal conductivity is preferable. On the other hand, material is not particularly limited as long as it is a ball-like shape, and resin or glass balls may also be employed. The hardness of the hard ball may be set within the margin of structural stability of the specimen holder.

Further, in the first embodiment, liquid nitrogen may be used as coolant 8 in the container of the cooling mechanism 7.

Further, in the first embodiment, at least the inner surface of the outer tubular unit 2 may be mirror-finished. For example, as a value of the parameter of surface roughness, the Ra value may be 0.2 micrometers or less.

Example 2

FIG. 2 shows a second embodiment. In the second embodiment, the specimen holder shaft unit is provided so as to traverse the cooling mechanism. In this embodiment, the specimen holder shaft unit is provided with heat conductive cam shaft 31 which is for rotating and Y-axis tilting both adjacent to the specimen placement unit 1, and a heat conduction rotary drive shaft 33 in the area of the cooling mechanism 7. The heat conduction rotary drive shaft unit 33 is connected via a heat propagation clamp member 35 to a container containing the coolant 8. The heat propagation clamp member 35 transmits the temperature of the coolant (for example, liquid nitrogen) to the specimen holder shaft unit 3. Moreover, the specimen holder in FIG. 2 includes a Y-axis tilt drive motor 9 at one end of the specimen holder shaft 3. For performing the X-axis tilt, the Y-axis tilt drive motor 9 may be used as the X-axis tilt drive motor, and the specimen holder shaft may be rotated for X-axis or Y-axis tilt by the drive motor.

Also in the second embodiment, the holding structure of the specimen holder shaft unit 3 in the outer tubular unit 2 including the hard ball 5 contributes to attaining the temperature stability.

And the specimen holder of the present disclosure includes a thermal drift adjusting unit 4 that suppresses or restrains thermal drift by utilizing a difference in thermal expansion coefficient of materials. A basic example 1 of the adjustment of thermal drift will be described next.

Example 1 of Thermal Drift Adjustment (1) Compare the ratio of the thermal expansion coefficient (at heat shrinkage) of the material A of the specimen holder shaft to the material B of the thermal drift adjusting unit, and the ratio of the length α of the material A to the length β of the material B (See FIG. 1 (1). Also see FIG. 3 (2) or FIG. 4 (2) both to be described later.).

(2) As an example, assuming that the thermal expansion coefficient of the material A is $6.0 \times 10^{-6}/°$ C. and the thermal expansion coefficient of the material B is $17.3 \times 10^{-6}/°$ C., the ratio of the thermal expansion of the material A to that of the material B is 6.0 to 17.3.

(3) In this example, it can be said that the material B relatively shrinks more and the material A relatively shrink less. The specimen holder of the present disclosure has a structure of pushing the amount of shrinkage by the pushing mechanism 6 from behind in the direction toward the specimen setting unit to mitigate the shrinkage of the material B (see the arrow in FIG. 1 (1). The same applies to FIG. 3 (2) and FIG. 4 (2) described later.).

(4) Then, as an example, the length α of the material A and the length β of the material B are determined so that the distance to be pushed corresponding to the shrinkage of the material B is equal to the distance of the shrinkage of the material A.

(5) That is, if the result of the amount of expansion plus the amount of shrinkage is set to zero, the drift is nil on the calculation.

Here, it is necessary to set the length α of the material A at first on the design (geometry) to some extent. An example 2 of thermal drift suppression in this case will be described next.

Example 2 of Thermal Drift Adjustment (1) By setting the length α of the material A of the specimen holder shaft to 23 mm, the length β of the material B of the thermal drift adjusting unit can be obtained and the reference surface (the surface as the basis of the thermal shrinkage to stop the specimen holder shaft unit 3 with which the hard ball 5 contacts) can be determined as well.

(2) The temperature at the phase of cooling a tip is assumed to be −170° C., taking into the consideration of radiant heat and heat inflow. Assuming the room temperature is +20° C. and when the length α of the material A is 23 mm, the amount of shrinkage at −170° C. is:

$$6.0(-170-20) \times 10^{-6} \times 23 = -0.02622 \text{ mm}$$

At this time, the case where the shrinkage amount of the material B is −0.02622 mm is shown by the following equation:

$$17.3(-170-20) \times 10^{-6} \times \text{length } \beta \text{ of material B} = -0.02622$$

From this equation, 7.977 mm is obtained as the length β of the material B.

Thus, for example, making the length of the material A as 23 mm and the length of the material B as 7.977 mm leads to the constant distance of the distance of the shrinkage of material A and the distance of the push of material B, and the drift can be suppressed. Existing holders require waiting for hours until the stabilization of temperature and thermal equilibrium. Only when liquid nitrogen runs out (the moment of losing cooling ability), atomic resolution imaging are possible. It normally needs about 3 hours in total for the stabilization of temperature no matter how short such waiting time may be. Compared with this, in the present disclosure, the structure makes it possible to nil always the influence of thermal shrinkage if desired, so that an advantage is that high resolution imaging is possible even immediately after the start of cooling. Therefore, according to the present disclosure, it is possible to significantly shorten the time to start data acquisition, and it is possible to overwhelmingly improve the productivity.

Moreover, conventionally, there is a problem that it is impossible to carry out EDS analysis (so-called EDS mapping/column mapping) with atomic resolution imaging if there is a drift. EDS analysis could not be carried out with existing holders for the reasons described above because it is necessary to keep the drift-zero state for at least 1 hour or longer. However, the structure of the present disclosure makes it possible to carry out EDS mapping, and the mechanism to counter the drift is expected to contribute largely to research development.

Moreover, not as Examples 1 and 2 above where thermal drift due to heat fluctuation is seriously made to zero, the degree of adjustment of the thermal drift may be set in a range practically effective for visualization, imaging, or analysis of the specimen. Further, although the drift adjustment by cooling has been described in the above Example 2, it is applicable not only to the drift due to cooling but also to the drift due to heating.

Moreover, note that the thermal drift adjustment of the specimen holder of the present disclosure is a technique utilizing the difference in thermal expansion coefficients. The materials A and B may be appropriately selected and are not specifically limited.

Example 3

FIG. 3 shows a third embodiment of the present disclosure. In this third embodiment, in addition to the same thermal drift suppression mechanism as the specimen holder 10 shown in FIGS. 1 and 2, a mechanism for the Y-axis tilt (around the axis orthogonal to the axial direction of the specimen holder shaft unit. The Y-axis tilt is also referred to as a two-axis tilt, or a β tilt.) of the specimen placement member 1 is provided. In this specimen holder, the heat conduction rotary drive shaft 31 may also serve as the specimen holder shaft unit. In this example, an inner tubular unit 40 is provided between the outer side of the heat conduction rotary drive shaft and the outer tubular unit 2. The inner tubular unit 40 is provided such that the heat conducting rotational drive shaft is rotatably installed, and the heat of the shaft can also be conducted to the inner tubular unit 40 (FIG. 3 (1) and FIG. 3 (2)). The heat of the inner tubular unit 40 which plays the role of the specimen holder shaft unit of the first embodiment as mentioned above is conducted to the thermal drift adjusting unit 41 disposed outside the inner tubular unit 40. Since the specimen holder has crankpin 11 offset from the central axis of the heat conduction rotation and Y-axis tilt camshaft 31, when the heat conduction rotation and Y-axis tilt camshaft 31 rotates, the Y-axis at the specimen center 1c of the specimen setting unit 1 is tilted. In other words, this specimen holder makes it possible to be applied as a dual-axis tilt cooling holder with a thermal drift suppression mechanism. FIGS. 3 (3) and 3 (4) show an image of the tilted specimen setting unit 1 when the thermal conduction rotation and Y-axis tilt cam shaft 31 is rotated by 90 degrees. In a case of this example, the inner tubular unit 40 serving as the specimen holder shaft unit and the thermal drift adjusting unit 41 form a partially contacted and fixed structure.

Moreover, increasing contact area 32 makes it possible to increase the efficiency of conducting heat from the heat conduction rotary drive shaft to the materials A and B. Further, by providing area 34 or the like, and protruding/groove form, transmitting the pressure of the pushing mechanism to the materials A and B becomes possible, and the contact area is further increased so that the efficiency of conducting the heat to the materials A and B can also be increased.

Moreover, in this example, the inner tubular unit 40 corresponding to the specimen holder shaft unit in FIG. 1 may be provided with protruding/groove portions, which receive the hard ball 5.

Example 4

FIG. 4 shows a fourth example of the present disclosure. The fourth embodiment shows a specimen tilting (X-axis tilt, the tilting with the rotation around the axis of specimen holder shaft; also referred to as a uniaxial tilt or α tilt), which is normally executed by a device of a TEM, as an application example of a specimen holder mechanism including thermal drift adjusting unit 51, executable by the holder itself. In this example, in addition to the thermal drift adjusting unit 51, a rotating mechanism is included. With this structure, it is possible to tilt the specimen by rotating only the inner shaft without rotating the entire specimen holder. Moreover, since the rotation angle is not limited, it goes without saying of an observation of a specimen at a higher angle of tilting (for tomographic data acquisition) and it is possible to observe and keep cooling of the back side surface of the initial observation surface of a specimen. In addition, in this example, the inner tubular unit 50 corresponding to the specimen holder shaft unit in FIG. 1 may be provided with protruding/groove portions, which may receive the hard ball 5. Moreover, in this example, the inner tubular unit 50 which plays the role of the specimen holder shaft unit, and the thermal drift adjusting unit 51 form a structure of partially contacted and fixed with each other.

As described above, the X-axis tilting can be originally controlled by a gonio (stage) of a microscope such as a TEM. The advantages of the specimen holder of the present disclosure are as follows. When tilting by a TEM, due to the tilting of the tank of liquid nitrogen together and spilling/bubbling of liquid nitrogen as a result, the holder cannot be tilted at a large angle. However, as in the specimen holder of the present disclosure, the tilting at a large angle is possible without tilting the tank or the like by rotating the shaft of the specimen holder. That is, in the present disclosure, the X axis tilting is executable without spilling liquid nitrogen.

In the X-axis tilt type of the specimen holder as the fourth embodiment, bearing 37 (FIG. 4 (2)) can be used for the rotation. A stable rotation can be achieved of the specimen holder shaft unit with the bearing 37.

Next, a mode where so-called vacuum drawing is performed using the specimen holder 10 of the present disclosure used in a TEM will be described. In FIG. 5, the gray area indicates the area where vacuum is established when performing vacuum drawing method of a Dewar in the specimen holder 10 of the present disclosure. When evacuation is completely carried out by the TEM in the specimen holder 10, the substantially same degree of vacuum at a practically acceptable level can be achieved in the entire region between the shaft unit and the outer tubular unit from the inside of a Dewar casing so that the impact of uneven radiant heat is not caused. In other words, the radiant heat received by the specimen holder 10 becomes substantially uniform. Since no sealing unit 91 (FIG. 6) of a conventional holder in its outer tubular is omitted, heat input from a device of a TEM or the like to the specimen holder 10 can be made extremely small. Moreover, in conventional holders, heating and evacuating of synthetic zeolite 95, which is a preliminary preparation, is unnecessary in the specimen holder 10 of the present disclosure.

In the specimen holder 10 of the present disclosure, in a case that at least the inner surface of the outer tubular unit 2 is mirror-finished, vacuum drawing using the vacuum exhaust of a TEM side becomes possible.

As described above, in the specimen holder of the present disclosure, since the influence of heat shrinkage can be reduced to a degree that is practically allowable or zero, a significant characteristic is that high resolution images can be obtained even immediately after starting of cooling, the length of time before data acquisition can be outstandingly reduced and the productivity in specimen observations can be overwhelmingly improved. In the specimen holder of the present disclosure, EDS mapping can also be executable, and the holder includes a mechanism that can be expected to contribute greatly to the research development.

Such a specimen holder having a Y-axis or an X-axis rotation mechanism and capable of cooling or the like has not been obtained conventionally. Furthermore, since the specimen holder of the present disclosure realizes thermal drift control to mitigate or suppress the adverse effect of thermal drift, the holder becomes one that can acquire high resolution in visualizing, imaging and analyzing a specimen.

INDUSTRIAL APPLICABILITY

Since the specimen holder of the present disclosure is the one which controls thermal drift, it can be expected to be useful in a wide range of industrial fields. The specimen holder of the present disclosure enables highly accurate visualizing, imaging or analyzing of a specimen such as EDS mapping or the like, and this can be expected to contribute greatly to the research development.

EXPLANATION OF REFERENCE NUMERALS 1 specimen and/or specimen mesh setting unit
1c center of specimen
2 outer tubular unit of specimen holder
3, 50 specimen holder shaft unit
3' specimen holder shaft unit (handle side)
4, 41, 51 thermal drift adjusting unit
5 hard ball
6 pushing mechanism (pressing mechanism or extruding mechanism)
7 cooling mechanism
8 coolant
9 Y-axis tilting drive motor
10 specimen holder
31 thermal conduction rotation and y-axis tilting cam shaft
32 contact area
33 thermal conduction rotation drive shaft
34 area
35 thermal propagation clamp member
36 thermal conduction rotation and X-axis tilting cam shaft
37 bearing
40 inner tubular unit
71 seal at rotation driving unit
90 conventional cooling holder
91 seal unit
93 liquid nitrogen
95 synthetic zeolite
A part made of material A
B part made of material B
V vacuum reaching part
α length of the region of material A
β length of the region of material B

What is claimed is:

1. A specimen holder comprising:
   a specimen holder shaft unit having a specimen and/or specimen mesh setting unit;
   an outer tubular unit capable of housing the specimen holder shaft unit;
   a thermal drift adjusting unit made of a material having a different thermal expansion coefficient from a thermal expansion coefficient of the specimen holder shaft unit, and partially in contact with the specimen holder shaft unit; and
   a control mechanism which controls movement of the thermal drift adjusting unit toward a center direction of the specimen.

2. The specimen holder according to claim 1, wherein the control mechanism is a hard ball.

3. The specimen holder according to claim 1, further comprising a pushing mechanism capable of extruding the specimen holder shaft unit toward the center direction of the specimen.

4. The specimen holder according to claim 1, further comprising a tapered portion in contact with the control mechanism on an inner wall of the outer tubular unit.

5. The specimen holder according to claim 1, wherein the specimen holder shaft unit is rotatable around an axis of the specimen holder.

6. The specimen holder according to claim 5, wherein the specimen and/or specimen mesh setting unit is capable of rotating about an axis of the specimen holder shaft unit or an axis orthogonal to the axis direction of the specimen holder shaft unit.

7. The specimen holder according to claim 6, wherein the rotation around the axis orthogonal to the axis direction of the specimen holder shaft unit is performed via an offset cam mechanism.

8. The specimen holder according to claim 6, further comprising an inner tubular unit between an outer side of the specimen holder shaft unit and the outer tubular unit, the thermal drift adjusting unit being partially in contact with the inner tubular unit.

9. The specimen holder according to claim 1, further comprising a cooling mechanism capable of cooling the specimen holder shaft unit.

10. The specimen holder according to claim 1, wherein an outer wall surface of the specimen holder shaft unit and an inner wall surface of the outer tubular unit are mirror-finished.

11. A method of evacuating the specimen holder according to claim 1 in an electron microscope, comprising performing vacuum drawing by utilizing a vacuum system of an electron microscope side.

* * * * *